United States Patent [19]

Perlman

[11] Patent Number: 5,274,531
[45] Date of Patent: Dec. 28, 1993

[54] LEAD FRAME WITH ALUMINUM RIVETS
[75] Inventor: Stanley M. Perlman, Northbrook, Ill.
[73] Assignee: The Intec Group, Inc., Palatine, Ill.
[21] Appl. No.: 716,093
[22] Filed: Jun. 17, 1991
[51] Int. Cl.⁵ .................. H01L 23/495; H05K 5/00
[52] U.S. Cl. ........................ 361/813; 174/52.4;
29/827; 257/672; 257/673; 257/698; 361/767;
439/71; 439/72
[58] Field of Search ............... 361/400, 403, 404, 405,
361/417, 419, 420, 421; 357/70, 69, 80; 29/827,
838, 839, 843; 228/120, 138, 175, 179; 174/52.1,
52.4, 253, 260, 263; 439/71, 72

[56] References Cited

U.S. PATENT DOCUMENTS

| | | | |
|---|---|---|---|
| 3,828,425 | 8/1974 | Manus | 174/52.4 |
| 4,447,857 | 5/1984 | Marks et al. | 361/403 |
| 4,707,724 | 11/1987 | Suzuki et al. | 357/70 X |
| 4,845,543 | 7/1989 | Okikawa et al. | 357/70 X |
| 4,942,454 | 7/1990 | Mori et al. | 357/70 |
| 4,990,720 | 2/1991 | Kaufman | 357/70 X |

OTHER PUBLICATIONS

Cochran et al, "Microcircuit Having Pinned Terminals", IBM Tech. Discl. Bulletin, vol. 8, No. 11, Apr. 1966.

Primary Examiner—Leo P. Picard
Assistant Examiner—Donald A. Sparks
Attorney, Agent, or Firm—Wood, Phillips, VanSanten, Hoffman & Ertel

[57] ABSTRACT

A lead frame for mounting a circuit component includes plural terminal legs for connection with a circuit. At least two of the terminal legs have pads for connection with the circuit component which has wire leads. The lead frame pads and wire leads are of materials which are incompatible for welding. A rivet of a material compatible for welding with the component lead wires is mounted in the pad of each terminal leg for connection with the circuit element. A weld secures each component lead wire with one of the rivets.

7 Claims, 1 Drawing Sheet

LEAD FRAME WITH ALUMINUM RIVETS

FIELD OF THE INVENTION

This invention relates to electrical connectors and, more particularly, to a rivet mounted in a lead frame to which a wire from an external circuit can be welded.

BACKGROUND OF THE INVENTION

Lead frames are used to facilitate the mechanical mounting and electrical connection of electronic elements on a circuit board. A lead frame with integral connectors is produced by initially stamping out the lead frame from an elongate piece of tin-plated copper alloy. During stamping, terminal legs are stamped on the outer periphery of the lead frame and a "window" is stamped out of the center of the lead frame. The lead frame is then encapsulated in a thermoplastic material except for the portion of the lead frame connected to the lead wires (adjacent the terminal leg). The lead frame is then cut between adjacent terminal legs to electrically isolate each lead wire and its associated terminal leg from other adjacent lead wires and their associated terminal legs. A circuit component is then mounted in the window and wire leads are attached between pads on the electrical element and the lead frame adjacent the desired terminal leg.

Typically, a wire is ultrasonically welded from the lead terminal on the lead frame to the desired pad on the circuit component. However, the lead wires cannot be ultrasonically welded to brass, copper or steel. Presently, the lead terminals of the lead frame are made with a strip of aluminum inlaid in the surface. The lead wires are then welded to the inlays. Because it is very difficult to plate aluminum, using an aluminum inlay is the only method feasible. However, the cost of inlaying aluminum into a strip of brass or copper is prohibitively high. Furthermore, the resulting weld to the inlaid aluminum is not as reliable as desired.

The present invention is directed to overcoming one or more of the problems discussed above.

SUMMARY OF THE INVENTION

In accordance with the invention, a lead wire, which is made of a material incompatible for welding to a lead frame, is welded to a rivet inserted in the lead frame and made of a material compatible for welding to the lead wire.

Broadly, there is disclosed herein a lead frame having plural terminal legs for connection with a circuit. At least two of the terminal legs have pads for connection with a circuit component to be mounted on the lead frame. The circuit component has wire leads. The lead frame pads and wire leads are made of materials which are incompatible for welding. A rivet of a material compatible for welding with the component lead wires is mounted in the pad of each terminal leg for connection with the circuit element. A weld secures each component lead wire with one of the rivets.

It is a feature of the invention that the component lead wires are ultrasonically welded to a flat head of the rivet.

It is another feature of the invention that the component lead wire and the rivet are made at least partially of aluminum.

In accordance with another aspect of the invention, the rivet is seated tightly enough to prevent rotation and to form a gas-tight seal between the head of the rivet and the pad of the terminal leg.

Further features and advantages of the invention will readily be apparent from the specification and from the drawings.

BRIEF DESCRIPTION OF THE DRAWINGS

FIG. 2 is a top view of a partially- manufactured lead frame;

DESCRIPTION OF THE INVENTION

Figure 1:
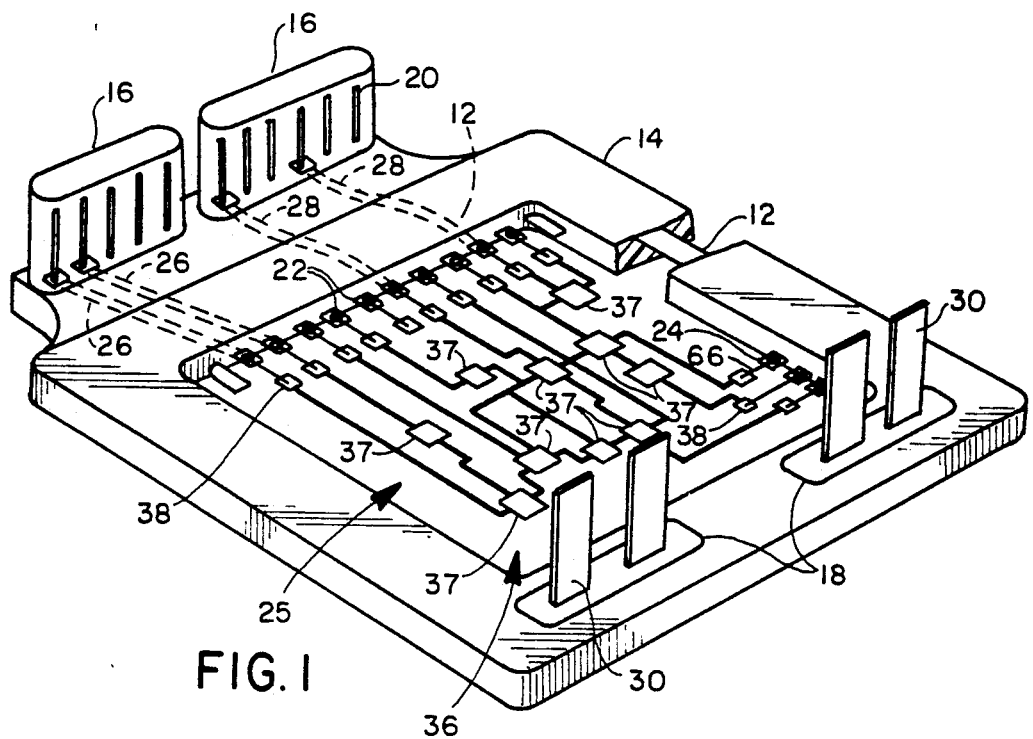
FIG. 1 is a perspective view of a lead frame encapsulated in a thermoplastic material.
Figure 2:
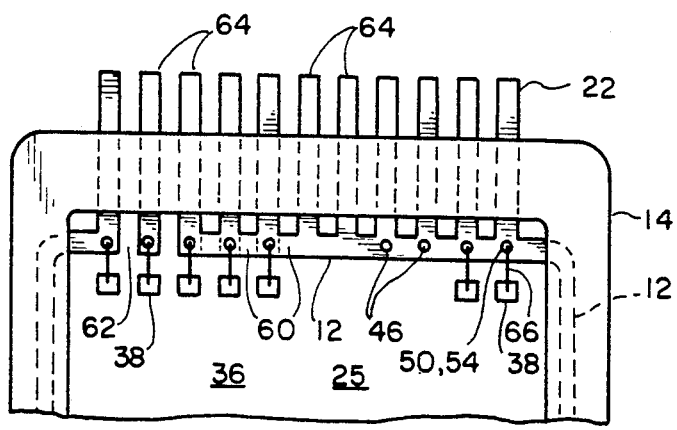
FIG. 2 is a side view of the lead frame of FIG. 1.
Figure 3:
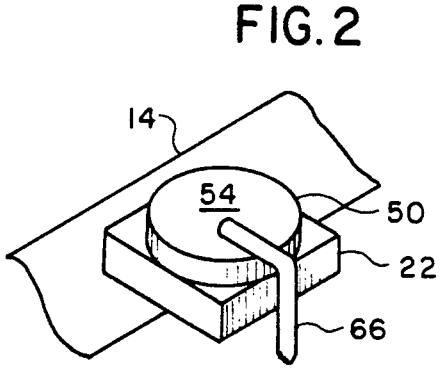
FIG. 3 is an enlarged view of one terminal leg with a rivet mounted therein and a wire welded thereto.

FIGS. 1 and 2 show a lead frame 12 encapsulated in a thermoplastic material 14. Lead frame 12 includes two sets of integral connectors 16,18. Integral connector 16 is a male connector and includes a plurality of pins 20. Lead frame 12 is typically formed from a tin-plated copper alloy, however other materials, such as brass, steel, etc., can also be used.

Lead frame 12 includes a plurality of terminal legs 22,24 extending through the thermoplastic material and into a window 25. As can be seen from dotted lines 26 and 28, the terminal leap 22 of lead frame 12 are connected in a consecutive orientation to the pins 20 through the thermoplastic material 14. While the connections between only four terminal legs and pins are shown, it should be understood that the other terminal legs are connected to the pins in order, as shown in FIG. 2. Terminal legs 24 are connected in a consecutive fashion to pins 30.

A component circuit 36, for example, an integrated circuit mounted on an insulating material, has multiple circuit elements 37 having interconnections therebetween and welding pads 38 for external connections. Preferably, the welding pads 38 of circuit component 36 are aligned inside the window 25 when circuit component 36 is attached to the thermoplastic material 14.

FIG. 2 illustrates the method of manufacturing the lead frame 12. Initially, the lead frame 12 is stamped from an elongate piece of tin-plated copper alloy. During stamping, the terminal legs 22 (terminal legs 24 not shown) are stamped on the outer periphery of the lead frame 12 and the window 25 is stamped out of the center of the lead frame 12. The circuit component holes 46 are punched in the lead frame at the innermost end of each terminal leg 22. Adjacent terminal legs 22 are not electrically isolated at this point. However, eventually, the lead frame 12 will be cut between adjacent terminal legs 22 to electrically isolate each terminal leg. Rivets 50, each having a flat head 54 and a stem 56, are then seated in the holes 46.

The insulating thermoplastic material 14 is then applied to the lead frame 12 to support the terminal legs 22. The lead frame 12 is then cut, for example, at dotted line 60 to electrically isolate the adjacent terminal legs 22, as best seen at 62. Ends 64 of terminal legs 22 can then be connected to integral connector 16 and pins 20.

The circuit component 36 having a lead wire 66 welded to the welding pad 38 is mounted to the lead frame 12. The lead wire 66 and rivet 50 are materials which are compatible for welding. The welding pads 38 are preferably positioned inside the window 25. The lead wire 66 is then ultrasonically welded to the flat head 54 of the rivet 50. During the welding process, the wire 66 and flat head 54 are typically deformed at 68 where they contact each other, as best seen in FIG. 4.

The rivet 50 is preferably made of a malleable material which can be formed into and used as a rivet, i.e. not too brittle. The material used for the rivet 50 is preferably electrically conductive and compatible for welding to the lead wire 66. Typically, rivet 50 is partially formed from aluminum, preferably aluminum alloy 3003-A14. Alternatively, the rivet 50 and lead wire 66 can be formed from nickel. The clearance between stem 56 and holes 46 (slightly exaggerated in FIG. 4) is preferably from 0.003 to 0.013 inches to effectuate a tight seal. Preferably, the rivet 50 is seated tightly enough to prevent rotation and to form a gas-tight seal between the head and the terminal leg 22,24. If moisture was allowed to penetrate the joint, the coupling between the tin-plated copper alloy of the lead frame 12 and the aluminum rivet 50 would corrode from the electrolytic action.

Figure 4:
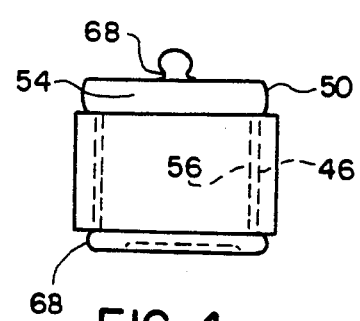
FIG. 4 is an enlarged side view of the rivet of FIG. 3.

Rivet 50 typically has a solid stem 56 and a flat head 54. Rivet 50 is installed in the following procedure:

Holes 46 are punched in the lead frame 12, the rivet 50 is inserted in the hole, and then the rivet 50 is set, as best seen in FIGS. 4 and 5. End 68 of rivet 50 is typically deformed by the anvil or setting tool. If desired, the rivet 50 can be annealed to soften it, after formation, for ease in setting and welding. Preferably, the surface is satin-etched to remove any scale. The adjacent pads and their associated rivets can be almost abutting. However, when the rivets are set simultaneously, the size of the anvil or setting tool may require an appropriate separation.

Thus, the invention broadly comprehends a lead wire welded to a rivet mounted in a lead frame. The lead wire is incompatible for welding to the lead frame but compatible for welding to the rivet. As a result, weld reliability and durability are increased as compared to the aluminum inlay method. Further, the cost of the aluminum rivet design is less than that of an aluminum inlay. The integral connectors allow for easy installation/repair/replacement.

The foregoing embodiment is illustrative of the broad inventive concepts contemplated by the invention.

I claim:

1. In a lead frame for mounting a circuit component, the lead frame having plural terminal legs for connection with a circuit, the improvement comprising:
    a circuit component including a plurality of lead wires of a material incompatible for welding to the terminal legs of the lead frame;
    a rivet of material compatible for welding with the circuit component lead wires mounted in each terminal leg for connection with the circuit element; and
    a weld securing each component lead wire with one of said rivets.

2. The lead frame of claim 1 wherein the rivet has a flat head to facilitate welding to the component lead wire.

3. The lead frame of claim 1 wherein the lead frame is tin-plated copper alloy.

4. The lead frame of claim 3 wherein the component wire lead and the rivet are aluminum.

5. The lead frame of claim 1 wherein the component wire lead and the rivet are nickel.

6. The lead frame of claim 1 wherein the rivet is seated tightly to prevent rotation.

7. The lead frame of claim 1 wherein the rivet is seated tightly to form a gas-tight seal between the head of the rivet and the terminal leg.

* * * * *